(12) United States Patent
Kim et al.

(10) Patent No.: US 9,960,186 B2
(45) Date of Patent: May 1, 2018

(54) BACK COVER AND TRANSPARENT DISPLAY APPARATUS USING THE SAME

(71) Applicant: LG Display Co., Ltd., Seoul (KR)

(72) Inventors: Jong Moo Kim, Seoul (KR); Jin-Hyun Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 14/985,069

(22) Filed: Dec. 30, 2015

(65) Prior Publication Data

US 2017/0062481 A1    Mar. 2, 2017

(30) Foreign Application Priority Data

Aug. 31, 2015 (KR) .......................... 10-2015-0123260

(51) Int. Cl.
*H01L 51/56* (2006.01)
*H01L 51/52* (2006.01)
(Continued)

(52) U.S. Cl.
CPC ...... *H01L 27/1218* (2013.01); *G02F 1/13452* (2013.01); *G02F 1/133308* (2013.01); *H01L 27/124* (2013.01); *H01L 27/1262* (2013.01); *G02F 1/15* (2013.01); *G02F 2001/133331* (2013.01); *G02F 2201/44* (2013.01); *G02F 2203/01* (2013.01)

(58) Field of Classification Search
CPC .. G02F 1/13452; H05K 3/361; G02B 6/0083; H01L 23/49827; H01L 51/52; H01L 23/4985; H01L 51/524; H01L 27/3276; H01L 27/3288; H01L 25/167; H01L 27/323

USPC .......... 257/40, 59, 72, 88, E27.131; 438/28, 438/151; 345/76, 204; 349/139, 150, 58
See application file for complete search history.

(56) References Cited

U.S. PATENT DOCUMENTS 4,862,153 A * 8/1989 Nakatani ............. G02F 1/13452
313/511
5,838,412 A    11/1998 Ueda et al.
(Continued)

FOREIGN PATENT DOCUMENTS

JP    S57-42073 A    3/1982
JP    09-043579       2/1997
(Continued)

OTHER PUBLICATIONS

European Search Report for European Patent Application No. EP 15202336, dated Feb. 7, 2017, 3 Pages.

*Primary Examiner* — Kimberly Rizkallah
*Assistant Examiner* — Brian Turner
(74) *Attorney, Agent, or Firm* — Fenwick & West LLP (57) ABSTRACT

Disclosed are a back cover and a transparent display apparatus including the same, in which a chip groove, into which a chip included in a chip-on film coupled to a transparent panel is inserted, is disposed in a rear surface. The transparent display apparatus includes a transparent panel and a back cover. The transparent panel may display an image. The back cover may be transparent, and the transparent panel may be disposed on a front of the back cover. A chip groove into which a chip included in a chip-on film coupled to the transparent panel is inserted may be disposed in a rear surface of the back cover.

19 Claims, 6 Drawing Sheets

(51) Int. Cl.
*G02F 1/13* (2006.01)
*H05K 1/02* (2006.01)
*G02F 1/1339* (2006.01)
*H01L 33/62* (2010.01)
*G02F 1/1333* (2006.01)
*H01L 27/12* (2006.01)
*G02F 1/1345* (2006.01)
*G02F 1/15* (2006.01)

(56) References Cited

U.S. PATENT DOCUMENTS

| | | | |
|---|---|---|---|
| 6,411,353 B1* | 6/2002 | Yarita | G02F 1/133308 |
| | | | 349/150 |
| 2002/0008805 A1 | 1/2002 | Kawakami et al. | |
| 2002/0047978 A1* | 4/2002 | Fukuta | G02F 1/13452 |
| | | | 349/149 |
| 2002/0071185 A1* | 6/2002 | Chretien | G02B 5/20 |
| | | | 359/629 |
| 2003/0222311 A1* | 12/2003 | Kim | G02F 1/13454 |
| | | | 257/347 |
| 2005/0105303 A1 | 5/2005 | Emde | |
| 2005/0190174 A1* | 9/2005 | Kim | G02F 1/13452 |
| | | | 345/204 |
| 2006/0176419 A1* | 8/2006 | Hayashimoto | G02F 1/133615 |
| | | | 349/58 |
| 2008/0117376 A1 | 5/2008 | Takenaka | |
| 2009/0213292 A1 | 8/2009 | Park et al. | |
| 2009/0251634 A1* | 10/2009 | Lu | H05K 1/189 |
| | | | 349/58 |
| 2010/0128198 A1 | 5/2010 | Kim et al. | |
| 2013/0082988 A1 | 4/2013 | Lee et al. | |
| 2013/0170116 A1* | 7/2013 | In | H05K 7/00 |
| | | | 361/679.01 |
| 2013/0235298 A1* | 9/2013 | Harada | G02F 1/133308 |
| | | | 349/58 |
| 2013/0307421 A1* | 11/2013 | Tanada | H05B 37/00 |
| | | | 315/172 |
| 2014/0183473 A1 | 7/2014 | Lee et al. | |
| 2014/0320782 A1 | 10/2014 | Uhm et al. | |
| 2016/0094838 A1* | 3/2016 | Koito | H04N 13/0477 |
| | | | 348/54 |

FOREIGN PATENT DOCUMENTS

| | | |
|---|---|---|
| JP | 09-205602 | 8/1997 |
| JP | 10-025975 | 1/1998 |
| JP | 2000-104464 A | 4/2000 |
| JP | 2004-271830 A | 9/2004 |
| JP | 2006-132206 A | 5/2006 |
| JP | 2010-160309 A | 7/2010 |
| JP | 2015-55712 A | 3/2015 |
| WO | WO 2011/108334 A1 | 9/2011 |
| WO | WO 2014/119972 A1 | 8/2014 |
| WO | WO 2015/064252 A1 | 5/2015 |

\* cited by examiner

BACK COVER AND TRANSPARENT DISPLAY APPARATUS USING THE SAME

CROSS-REFERENCE TO RELATED APPLICATION

This application claims the benefit of the Korean Patent Application No. 10-2015-0123260 filed on Aug. 31, 2015, which is hereby incorporated by reference as if fully set forth herein.

BACKGROUND

Field of the Invention

The present invention relates to a back cover and a transparent display apparatus including the same.

Discussion of the Related Art

A display apparatus is applied to various electronic devices such as portable phones, tablet personal computers (PCs), notebook PCs, monitors, etc. Examples of the display apparatus include liquid crystal display (LCD) apparatuses, organic light emitting display apparatuses, etc.

In such display apparatuses, the LCD apparatuses are being the most widely commercialized at present because the LCD apparatuses are easily manufactured due to the advance of manufacturing technology and realize a drivability of a driver and a high-quality image. In such display apparatuses, the organic light emitting display apparatuses have a fast response time and low power consumption, and thus are attracting much attention as next generation FPD devices.

Recently, transparent display apparatuses for transmitting light are being developed for the purpose of satisfying requirements of users that prefer various functions and various designs.

Figure 1:
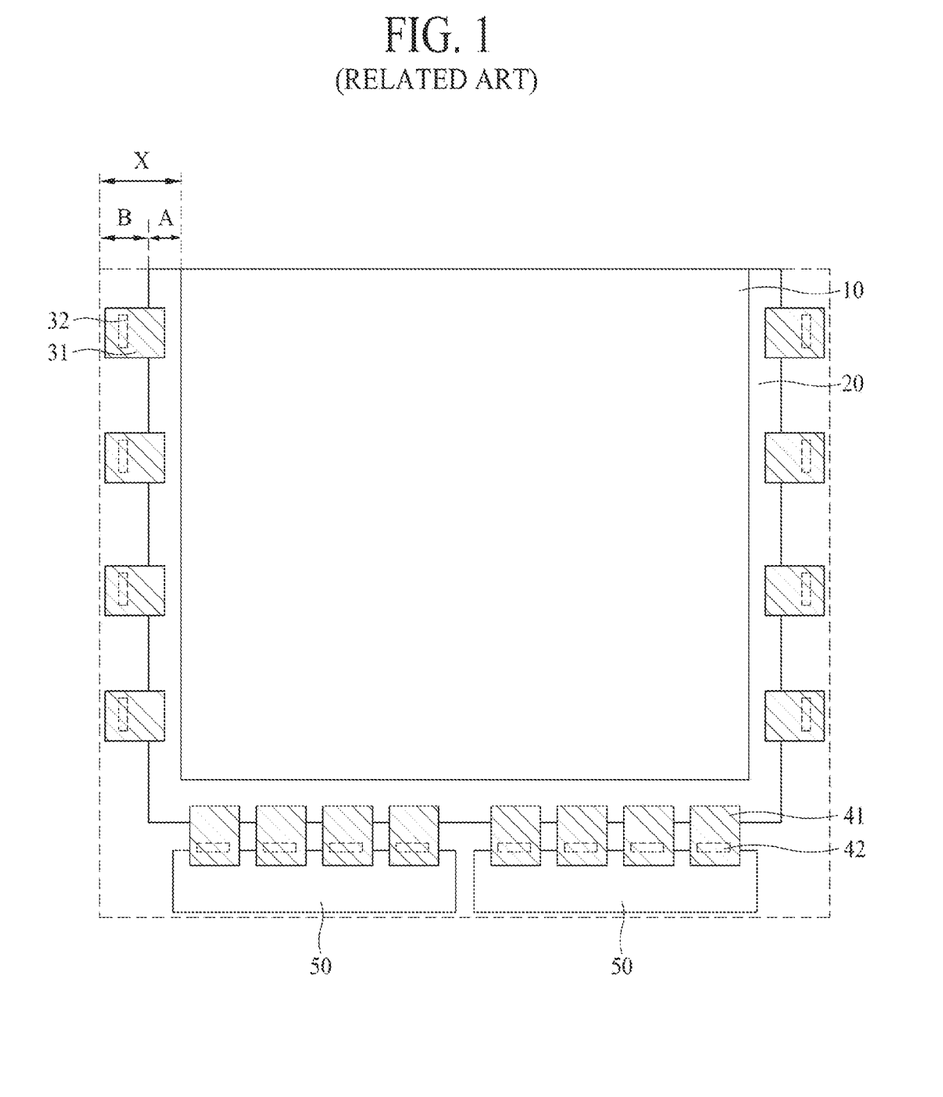
FIG. 1 is an exemplary diagram illustrating the front of a transparent panel of transparent display apparatus according to related art.

FIG. 1 is an exemplary diagram illustrating the front of a transparent panel applied to a related art transparent display apparatus. A gate driver chip-on film 31 equipped with a gate driver chip 32 performing a function of a gate driver, as illustrated in FIG. 1, is attached to at least one of a left side and a right side of the front of a transparent panel 10 applied to the related art transparent display apparatus. Particularly, the gate driver chip-on film 31 is attached to a pad part 20 of a lower substrate configuring the transparent panel 10. One or more gate driver chip-on films 31 may be provided.

A data driver chip-on film 41 equipped with a data driver chip 42 performing a function of a data driver is attached to a lower end of the front of the transparent panel 10, and the data driver chip-on film 41 is attached to a printed circuit board (PCB) 50.

An active area of the transparent panel 10 applied to the related art transparent display apparatus is transparent. If the gate driver chip-on film 31 is bonded and attached to a rear surface of the transparent panel 10, the gate driver chip-on film 31 may be disposed in the active area.

Therefore, in the related art transparent display apparatus, when the gate driver chip-on film 31 is disposed as illustrated in FIG. 1, the gate driver chip-on film 31 is mounted in an enclosing such as a case. For this reason, in the related art transparent display apparatus, a size of a bezel increases by a size of a width of the gate driver chip-on film 31.

For example, a size X of a bezel of each of the left side and right side of the related art transparent display apparatus corresponds to a sum of a width A of the pad part 20 and a width B of a portion of the gate driver chip-on film 31 protruding externally to the pad part 20.

To provide an additional description, in the related art transparent display apparatus, the gate driver chip-on film 31 mounted on at least one of the left side and right side of the front of the transparent panel 10 protrudes from a side surface of the transparent panel 10. In a state where the gate driver chip-on film 31 protrudes, the gate driver chip-on film 31 is covered by the case. For this reason, the sizes of a left bezel and a right bezel of the transparent display apparatus including the transparent panel 10 are increased.

SUMMARY

Embodiments relate to a transparent display device including a transparent panel, at least one flexible substrate and a back cover. The transparent panel includes pixels for generating images. At least one flexible substrate is bent backwards. Each of the flexible substrate has one end electrically coupled to a pad region of the transparent panel. Each of the flexible substrate includes at least one integrated circuit (IC) chip configured to apply signals to gates of transistors in the pixels. The back cover is provided at a rear side of the transparent panel. The back cover has at least one groove on a rear surface of the back cover to accommodate the IC chip of the at least one flexible substrate.

In one embodiment, the transparent display device further includes a light shield panel between the transparent panel and the back cover, the light shield panel switching between a blocking mode and a transmit mode. Light entering through the back cover blocked by the light shield panel in the blocking mode, at least part of light entering through the back cover transmitted to the transparent panel via the light shield panel in the transmit mode.

In one embodiment, the transparent back cover includes a curved edge abutting the bent flexible substrate to define curvature of the flexible substrate.

In one embodiment, the transparent panel includes an upper substrate and a lower substrate between the upper substrate and the transparent back cover. The lower substrate includes the pad region, and wherein the flexible substrate is bent backward over the lower substrate.

In one embodiment, the transparent display device further includes at least one film housing covering the at least one flexible substrate and pressing the IC chip of the at least one flexible substrate into the at least one groove.

In one embodiment, each of the film housing includes a first portion covering part of a front surface the transparent panel facing away from the back cover, a second portion covering part of the rear surface of the back cover, and a third portion connecting the first and second portions. The first portion is pressed onto the front surface and the second portion is pressed onto the rear surface of the back cover by resilient force.

In one embodiment, at least one groove comprises a plurality of grooves formed on the rear surface of the transparent back cover to accommodate a plurality of IC chips.

In one embodiment, the groove extends from one edge of the back cover to another edge of the back cover.

Embodiments also relate to a back cover in a transparent display device including a front side, a rear side, and a curved edge. The front side faces a front side facing a transparent panel comprising pixels for generating images. The rear side of the transparent panel is formed with at least one groove to accommodate at least one integrated circuit (IC) chip mounted on at least one flexible substrate and apply signals to gates of transistors in the transparent panel via the pad region to generate the images. Each of the flexible substrate having one end electrically coupled to a pad region of the transparent panel. The curved edge abutting the at least one flexible substrate that is bent backwards, the curved edge configured to define curvature of the flexible substrates.

In one embodiment, the transparent panel includes an upper substrate and a lower substrate between the upper substrate and the transparent back cover. The lower substrate includes the pad region. The flexible substrate is bent backward over the lower substrate.

Embodiments also relate to manufacturing of a transparent display device. An end of a flexible substrate is coupled to a pad region of a transparent panel. The flexible substrate is bent backward over a curved edge of a back cover at a rear side of the transparent panel so that a rear surface of the flexible substrate abuts the curved edge of the back cover. An integrated circuit (IC) chip of the flexible substrate is accommodated in a groove at a rear side of the back cover. The IC chip applies signals to gates of transistors in the pixels.

In one embodiment, the flexible substrate is covered by a film housing.

In one embodiment, the flexible substrate is bent over an edge of a light shield panel switching between a blocking mode and a transmit mode. Light enters through the back cover blocked by the light shield panel in the blocking mode. At least part of light entering through the back cover transmitted to the transparent panel via the light shield panel in the transmit mode.

In one embodiment, the back cover is formed with the groove at the rear side of the back cover.

In one embodiment, the flexible substrate is bent over a lower substrate of the transparent panel but not bent over an upper substrate of the transparent panel, the pad region provided in the lower substrate of the transparent panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the present invention is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Figure 2:
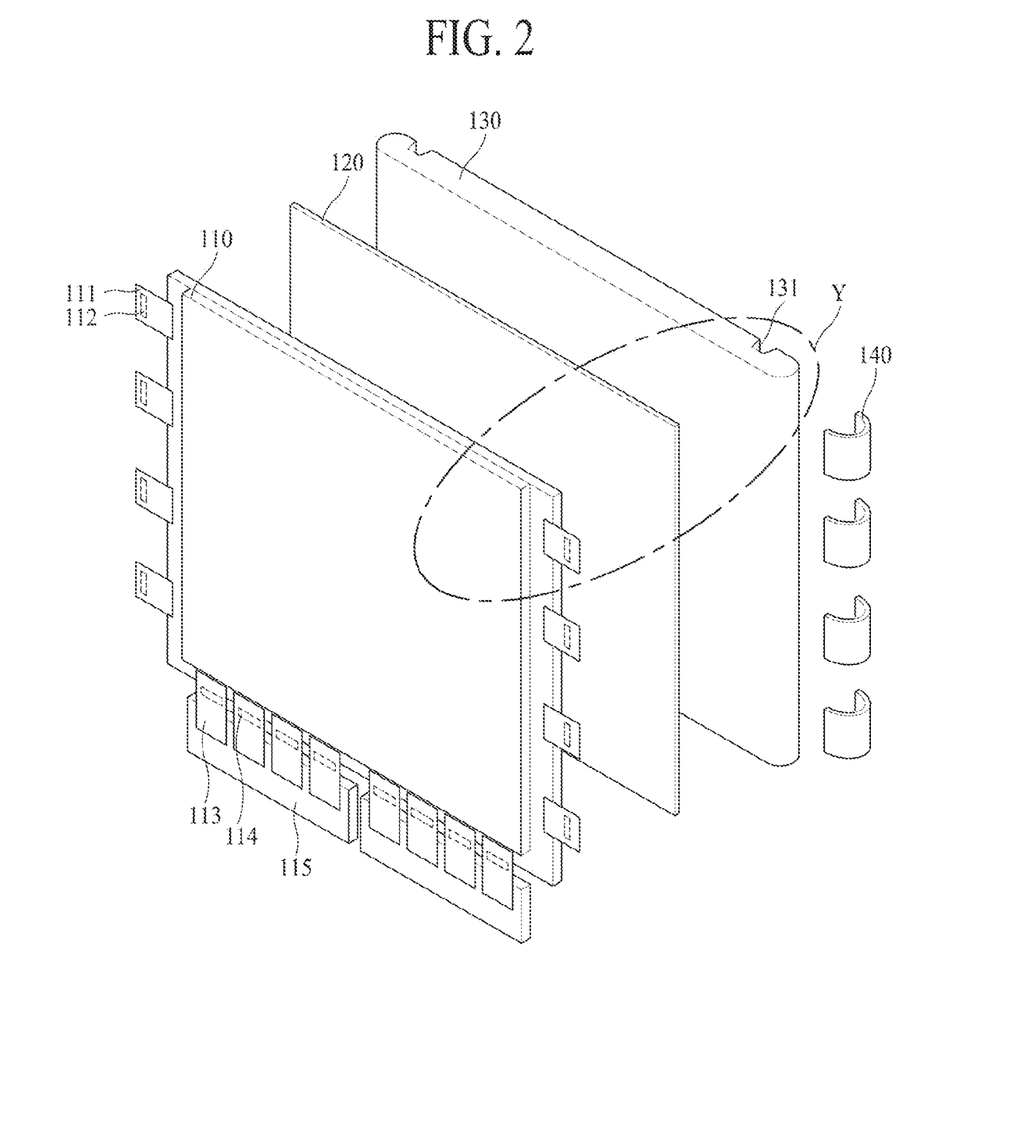
FIG. 2 is an exemplary diagram illustrating a configuration of a transparent display apparatus according to an embodiment of the present invention.

FIG. 2 is an exemplary diagram illustrating a configuration of a transparent display apparatus according to an embodiment of the present invention. The transparent display apparatus according to an embodiment of the present invention, as illustrated in FIG. 2, may include a transparent panel 110 that is transparent, a back cover 130 that is transparent, a light shield panel 120 that is disposed on a rear surface of the transparent panel 110 and a front of the back cover 120 to adjust a light transmittance, and a film housing 140 that is mounted on the transparent panel 110, the light shield panel 120, and the back cover 130 to cover a side surface of the transparent panel 110, a side surface of the light shield panel 120, a side surface of the back cover 130, and the chip-on film 111. The light shield panel 120 may be disposed on the front of the back cover 130, and a chip groove 131 for receiving a gate driver chip 112 of a gate driver chip-on film 111 (coupled to the transparent panel 110) may be disposed in a rear surface of the back cover 130.

First, the transparent panel 110 may be implemented as a liquid crystal display panel, an organic light emitting display panel, or the like. The transparent panel 110 may include a plurality of gate lines and a plurality of data lines. A plurality of pixels included in the transparent panel 110 may display an image according to a gate pulse supplied through the gate lines and data voltages supplied through the data lines. If the transparent panel 110 is implemented as the organic light emitting display panel, the organic light emitting display panel may be manufactured in a top emission type. The transparent panel 110 having the top emission type may display an image in a direction toward a front at which a user is located. The plurality of pixels may be arranged in the transparent panel 110, and may be divided by a plurality of panel partition walls or a plurality of black matrixes. For example, when the transparent panel 110 is the liquid crystal display panel, the pixels may be divided by the black matrixes, and when the transparent panel 110 is the organic light emitting display panel, the pixels may be divided by the panel partition walls.

In each of the pixels, an area that displays an image may be referred to as a transmissive part, and another area that cannot display an image due to the black matrixes or the panel partition walls may be referred to as a non-transmissive part.

When the transparent panel 110 is the liquid crystal display panel, liquid crystal, a plurality of transparent pixel electrodes, and a transparent common electrode may be disposed in the transmissive part, and the black matrixes, the gate lines, the data lines, and a plurality of thin film transistors (TFTs) for driving the liquid crystal may be disposed in the non-transmissive part.

When the transparent panel 110 is the organic light emitting display panel, a plurality of organic light emitting diodes (OLEDs) emitting light may be disposed in the transmissive part, and the partition walls and various elements for driving each of the OLEDs may be disposed in the non-transmissive part.

The gate driver chip-on film 111 equipped with the gate driver chip 112 performing a function of a gate driver may be attached to at least one of a left side and a right side of the front of the transparent panel 110. Particularly, the gate driver chip-on film 111 may be attached to a pad part of a lower substrate configuring the transparent panel 110.

One or more gate driver chip-on film 111 may be provided. In FIG. 2, the transparent panel 110 where the gate driver chip 112 is attached to each of the left side and right side of the transparent panel 110 is illustrated. Also, four gate driver chip-on films 111 may be attached to each of the left side and right side of the transparent panel 110 illustrated in FIG. 2.

The gate driver chip 112 may sequentially supply a gate pulse to the gate lines included in the transparent panel 110. While the gate pulse is being supplied, data voltages may be respectively supplied to the data lines included in the transparent panel 110, and thus, an image may be displayed in units of one horizontal line corresponding to a gate line to which the gate pulse is being supplied.

A data driver chip-on film 113 equipped with a data driver chip 114 performing a function of a data driver is attached to a lower end of the front of the transparent panel 110, and the data driver chip-on film 113 may be attached to a PCB 115.

The data driver chip 114 may respectively supply the data voltages to the data lines while the gate pulse is being supplied to a corresponding gate line by the gate driver chip 112.

A controller (not shown) may be disposed on the PCB 115. The controller may generate a gate control signal for controlling the gate driver chip 112 and a data control signal for controlling the data driver chip 114 and may respectively transfer the gate control signal and the data control signal to the gate driver chip 112 and the data driver chip 114.

According to an embodiment of the present invention, the gate driver chip 112 equipped in the gate driver chip-on film 111 may be inserted into the chip groove 131 included in the back cover 130. Therefore, the gate driver chip-on film 111 may be simply referred to as a chip-on film 111, and the gate driver chip 112 may be simply referred to as a chip 112.

Second, the light shield panel 120 may be disposed on the rear surface of the transparent panel 110. The light shield panel 120 may adjust a transmittance of light irradiated from a rear-surface direction of the transparent display apparatus and may transfer the transmittance-adjusted light to the transparent panel 110.

The transparent display apparatus including the transparent panel 110 may allow a background of the transparent display apparatus to be visible while displaying an image, and thus is being widely used. However, some users may not desire to render the background of the transparent display apparatus visible. Also, an image displayed by the transparent display apparatus can become unclear due to the background of the transparent display apparatus. In such case, the users may change a transmittance of the light shield panel 120.

The transparent display apparatus has a good contrast ratio in a dark environment, but a contrast ratio is degraded in a normal environment having light. Therefore, the light shield panel 120 for realizing a light shield mode where light is blocked and a transmissive mode where the light is transmitted may be used for preventing a contrast ratio from being degraded.

The light shield panel 120 may use a panel having electrochromic characteristic, or may use a panel using liquid crystal. A configuration of the light shield panel 120 will be briefly described below.

The light shield panel 120 having the electrochromic characteristic may include a lower base substrate, a lower auxiliary electrode, a lower main electrode, a lower substrate, an upper base substrate, an upper auxiliary electrode, an upper main electrode, an upper substrate with a counter material coated thereon, and an electrolytic material disposed between the lower substrate and the upper substrate. Here, a lower electrochromic material may be coated on the lower substrate, the upper base substrate, the upper auxiliary electrode, and the upper main electrode.

In this case, each of the lower base substrate and the upper base substrate may be a plastic film. Each of the lower auxiliary electrode and the upper auxiliary electrode may be an opaque electrode. The opaque electrode may be formed of materials such as copper (Cu) and aluminum (Al), but is not limited to these materials.

Each of the lower main electrode and the upper main electrode may be a transparent electrode. The transparent electrode may be formed of materials such as indium tin oxide (ITO) and indium zinc oxide (IZO), but is not limited to these materials.

When a voltage is applied to the lower main electrode and the upper main electrode, an oxidation-reduction reaction may be performed on the lower electrochromic material, the counter material, and the electrolytic material, and thus, a color of the lower electrochromic material may be changed.

The lower electrochromic material may include a core material, such as transparent conductive oxide (TCO), and an electrochromic material bonded to the core material. The core material may use $TiO_2$, $In_2O_3$, $SnO_2$, $RuO_2$, or a material produced by surface-processing $TiO_2$ on ITO.

The electrochromic material may use a material which has a certain color by absorbing the certain color when a reduction reaction is performed, and becomes transparent when an oxidation reaction is performed. For example, the electrochromic material may be 1,1'-dibenzyl-4,4'-bipyridinium bistetrafluorborate.

The electrolytic material may include an electrolyte, a polymer, and an ultraviolet (UV) initiator. The electrolyte may be lithium perchlorate, t-butylammoinum perchlorate, t-butylammoinum-tfluoroborate, or tetrabutylammonium trifluoromethanesulfonate. The polymer may be an acrylate-based polymer, a polyether-based polymer, or an epoxy-based polymer. The U initiator may be benzoester or amine.

The light shield panel 120 using liquid crystal may include a lower substrate, an upper substrate, and a liquid material. In this case, the lower substrate may include a lower base substrate and a lower electrode, and the upper substrate may include an upper base substrate and an upper electrode. Each of the lower base substrate and the upper base substrate may be a plastic film.

The liquid material may be injected between a plurality of partition walls included in the lower substrate or the upper substrate and between the lower substrate or the upper substrate. The liquid material may be liquid crystal.

A refractive index of the liquid crystal may be changed by a voltage applied to the upper electrode and the lower electrode, and thus, a transmittance of the light shield panel 120 may be changed. However, the light shield panel 120 may not be included in the transparent display apparatus according to an embodiment of the present invention.

Third, the back cover 30 may be formed of a transparent material, and for example, may be a transparent glass substrate.

The light shield panel 120 may be disposed on the front of the back cover 130, and the chip groove 131, into which the chip 112 included in the chip-on film 111 coupled to the transparent panel 110 is inserted, may be disposed in the rear surface of the back cover 130.

To provide an additional description, the back cover 130 may include the front on which the transparent panel 110 is disposed, the rear surface including the chip groove 131 into which the chip 112 included in the chip-on film 111 coupled to the transparent panel 110 is inserted, and a side surface which is rounded for guiding the chip-on film 111.

Fourth, the film housing 140 may be mounted on the transparent panel 110, the light shield panel 120, and the back cover 130 to cover the side surface of the transparent panel 110, the side surface of the light shield panel 120, the side surface of the back cover 130, and the chip-on film 111.

If the light shield panel 120 is omitted, the film housing 140 may cover only the side surface of the transparent panel 110 and the side surface of the back cover 130 and may cover the chip-on film 111.

When a plurality of the chip-on films 111 are attached to the transparent panel 110, the film housing 140 may cover each of the chip-on films 111 and may also cover all the chip-on films 111. For example, in FIG. 2, the transparent panel 110 where four the chip-on films 111 are disposed on its one side is illustrated, and thus, four film housings 140 for covering the four chip-on films 111 are illustrated. In an alternative embodiment of the present invention, all of the four chip-on films 111 may be covered by one film housing 140.

As described above, the present invention may be applied to a transparent display apparatus using a transparent panel. The reason is because it is difficult for the transparent display apparatus to use a gate-in panel (GIP) type where a gate driver is built into the transparent panel. For example, in order to transparentize a non-display area into which a gate driver having the GIP type is built, an interval between TFTs configuring the gate driver should be broadened. Also, an ultraviolet (UV) curing method may be used for bonding an upper substrate to a lower substrate in the non-display area into which the gate driver having the GIP type is built, and in this case, an interval between TFTs configuring the gate driver should be broadened for performing the UV curing method. Therefore, the non-display area is enlarged in a transparent panel using the GIP type. Accordingly, in the transparent display apparatus including the transparent panel according to the present invention, the chip-on film 111 equipped with the chip 112 may be attached to the transparent panel 110.

Figure 3:
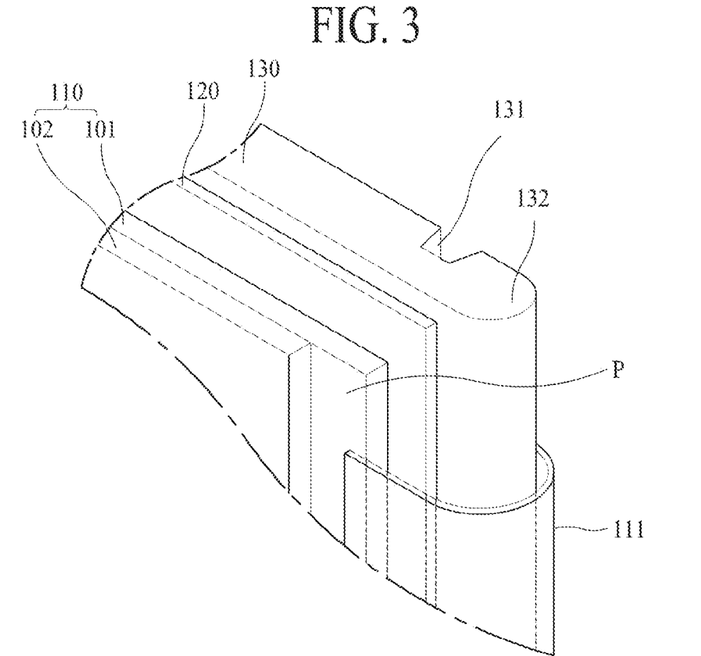
FIG. 3 is an exemplary diagram illustrating a front of an edge of the transparent display apparatus according to an embodiment of the present invention.
Figure 4:
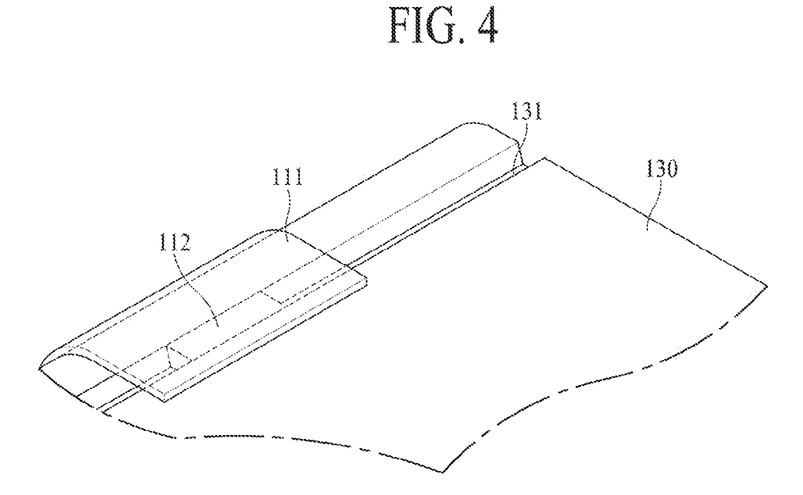
FIG. 4 is an exemplary diagram illustrating a rear surface of the edge illustrated in FIG. 3.

FIG. 3 is an exemplary diagram illustrating a front of an edge of the transparent display apparatus according to an embodiment of the present invention, and particularly, is an exemplary diagram illustrating an area Y illustrated in FIG. 2. In FIG. 2, the transparent panel 110, the light shield panel 120, and the back cover 130 are separated from each other. However, FIG. 3 illustrates the area Y where the transparent panel 110, the light shield panel 120, and the back cover 130 are coupled to each other. FIG. 4 is an exemplary diagram illustrating a rear surface of the edge illustrated in FIG. 3.

The transparent display apparatus according to an embodiment of the present invention, as described above, may include the transparent panel 110, the light shield panel 120, the back cover 130, and the film housing 140. Here, the light shield panel 120 and the film housing 140 may be omitted. In the transparent display apparatus illustrated in FIGS. 3 and 4, the film housing 140 may be omitted, and the light shield panel 120 may be provided.

As illustrated in FIG. 3, the transparent panel 110 and the light shield panel 120 may be disposed on the front of the back cover 130. And as illustrated in FIG. 4, the rear surface of the back cover 130 may formed with the chip groove 131 into which the chip 112 included in the chip-on film 111 coupled to the transparent panel 110 is inserted.

The chip-on film 111 may be bent along the rounded side surface of the back cover 130 as illustrated in FIG. 3 and may be disposed on the rear surface of the back cover 130 as illustrated in FIG. 4. The chip 112 included in the chip-on film 111 may be inserted into the chip groove 131 in the rear surface of the back cover 130.

As described above, the chip 112 may perform the function of a gate driver.

The transparent panel 110 may include an upper substrate 102 and a lower substrate 101. The chip-on film 111 may be attached to a pad part P of the lower substrate 101. One or more of the chip-on films 111 may be attached to the pad part P. Four chip-on films 111 may be attached to the pad part P illustrated in FIG. 2.

In this case, a plurality of the chip grooves 131 corresponding to the chip-on films 111 may be disposed in the rear surface of the back cover 130. The chip grooves 131 for receiving each of the chips 112 on the chip-on films 111 is separately inserted in the rear surface of the back cover 130. For example, when four chip-on films 111 are attached to the pad part P, four chip grooves 131 may be separately disposed in the rear surface of the back cover 130. In this case, each of the four chips 131 in the four chip-on films 111 may be inserted into each of the four chip grooves 131. Since the chip groove 131 is not across the entirety of the rear surface of the back cover 130, the chip groove 131 can be formed quickly.

Alternatively, as illustrated in FIG. 4, in order for the chips included in the chip-on films to be inserted into the chip grooves 131, the chip grooves 131 may be continuously arranged from one end to the other end of the rear surface of the back cover 130. Since the chip grooves 131 are continuously arranged, the process of forming the chip grooves 131 is simplified.

A width of the chip groove 131 may be equal to or greater than that of the chip 112.

Figure 5:
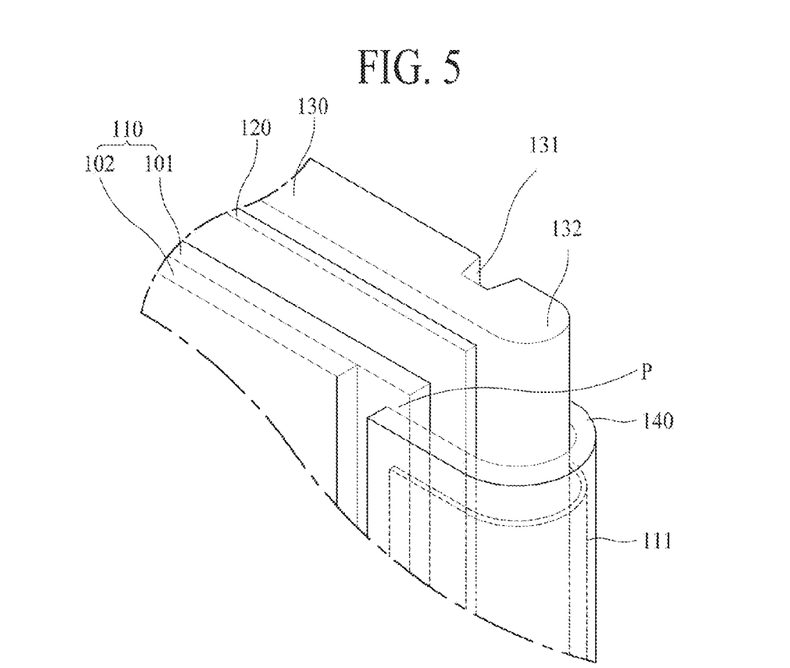
FIG. 5 is another exemplary diagram illustrating a front of an edge of the transparent display apparatus according to an embodiment of the present invention.
Figure 6:
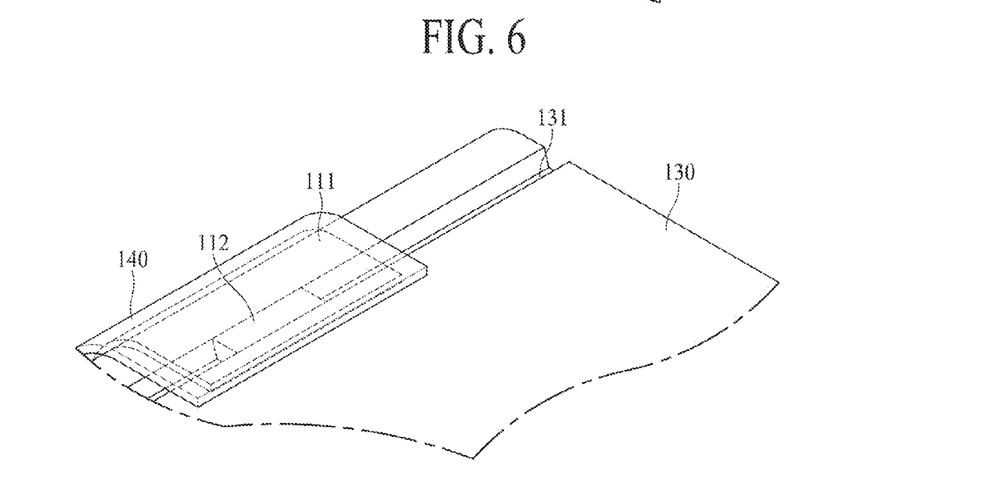
FIG. 6 is an exemplary diagram illustrating a rear surface of the edge illustrated in FIG. 5.

FIG. 5 is another exemplary diagram illustrating a front of an edge of the transparent display apparatus according to an embodiment of the present invention, and particularly, is an exemplary diagram illustrating the area Y illustrated in FIG. 2. In FIG. 2, the transparent panel 110, the light shield panel 120, and the back cover 130 are separated from each other. However, FIG. 5 illustrates the area Y where the transparent panel 110, the light shield panel 120, and the back cover 130 are coupled to each other. FIG. 6 is an exemplary diagram illustrating a rear surface of the edge illustrated in FIG. 5.

The transparent display apparatus according to an embodiment of the present invention, as described above, may include the transparent panel 110, the light shield panel 120, the back cover 130, and the film housing 140. The light shield panel 120 and the film housing 140 may be omitted in some embodiments.

The film housing 140 may closely adhere the chip-on film 111 to the side surface of the transparent panel 110, the side surface of the light shield panel 120, and the side surface of the back cover 130 to secure the chip-on film 111 to the back cover 130. Therefore, the film housing 140 may be omitted.

However, the transparent display apparatus illustrated in FIGS. 5 and 6 may include the film housing 140 and the light shield panel 120.

The transparent display apparatus illustrated in FIGS. 3 and 4 may not include the film housing 140, but the transparent display apparatus illustrated in FIGS. 5 and 6 may include the film housing 140. Therefore, except that the transparent display apparatus illustrated in FIGS. 5 and 6 further includes the film housing 140, the transparent display apparatus illustrated in FIGS. 5 and 6 may have the same configuration and function as those of the transparent display apparatus illustrated in FIGS. 3 and 4. Hereinafter, therefore, only the film housing 140 will be described.

The film housing 140 may be mounted on the transparent panel 110, the light shield panel 120, and the back cover 130 to cover the side surface of the transparent panel 110, the side surface of the light shield panel 120, and the side surfaces of the back cover 130. Particularly, the film housing 140 may cover the chip-on film 111.

In this case, as illustrated in FIG. 5, one side of the film housing 140 may be disposed in the pad part P of the transparent panel 110 to cover one side of the chip-on film 111 coupled to the pad part P.

Moreover, as illustrated in FIG. 6, the other side of the film housing 140 may be disposed on the rear surface of the back cover 140 to cover the other side of the chip-on film 111 disposed on the rear surface.

The film housing 140 may be elastic which causes the one side of the film housing 140 to deform towards the other side. Therefore, the film housing 140 may be closely adhered to the pad part P and the rear surface of the back cover 130. Accordingly, the film housing 140 may be fixed to the side surfaces of the transparent panel 110, the light shield panel 120, and the back cover 130.

Moreover, since the film housing 140 is fixed to the side surfaces of the transparent panel 110, the light shield panel 120, and the back cover 130, the chip-on film 111 may be covered by the film housing 140, thereby protecting the chip-on film 111. The film housing 140 may be formed of magnesium (Mg), rubber, urethane, and/or the like.

Figure 7:
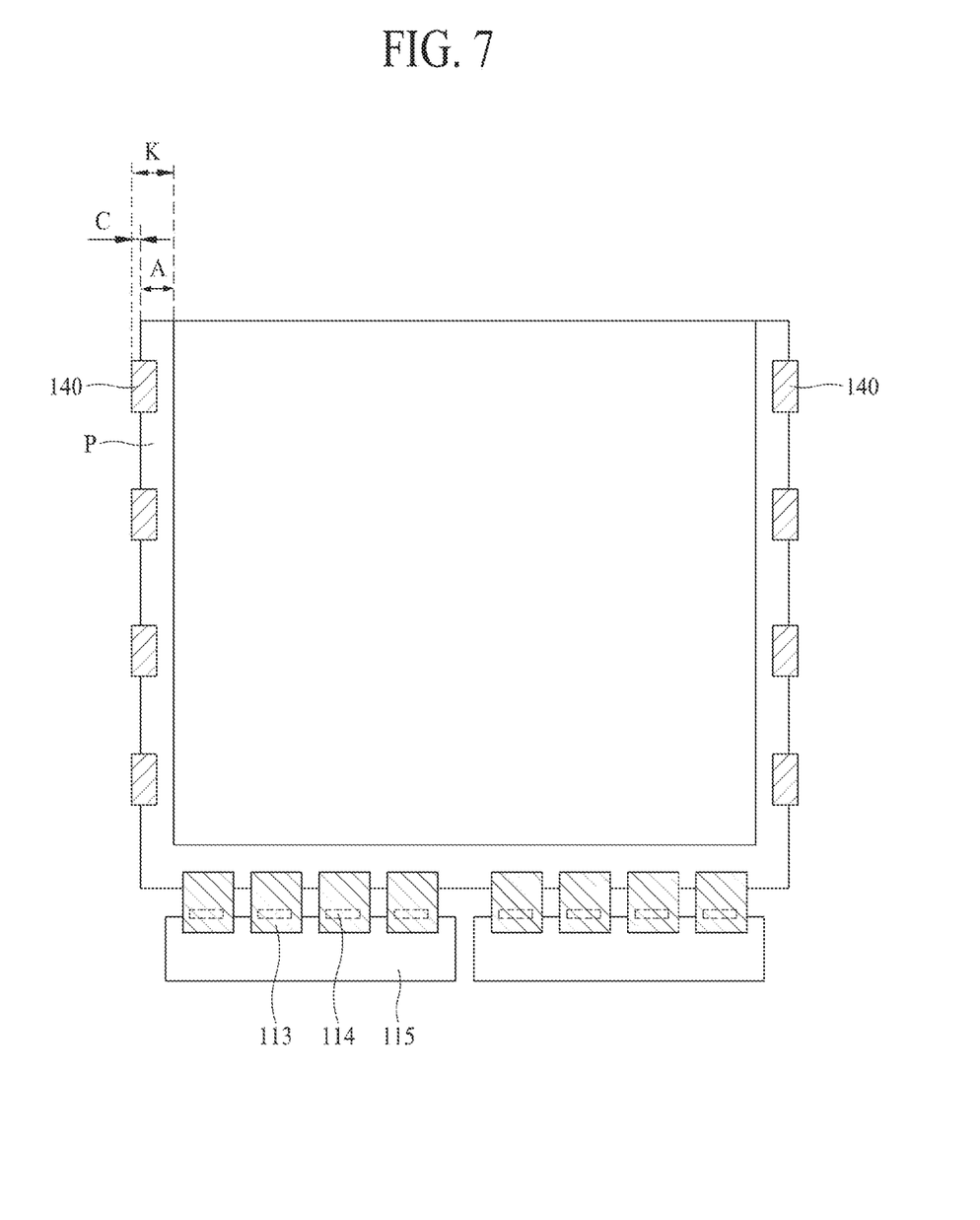
FIG. 7 is an exemplary diagram illustrating a front of the transparent display apparatus according to an embodiment of the present invention.
Figure 8:
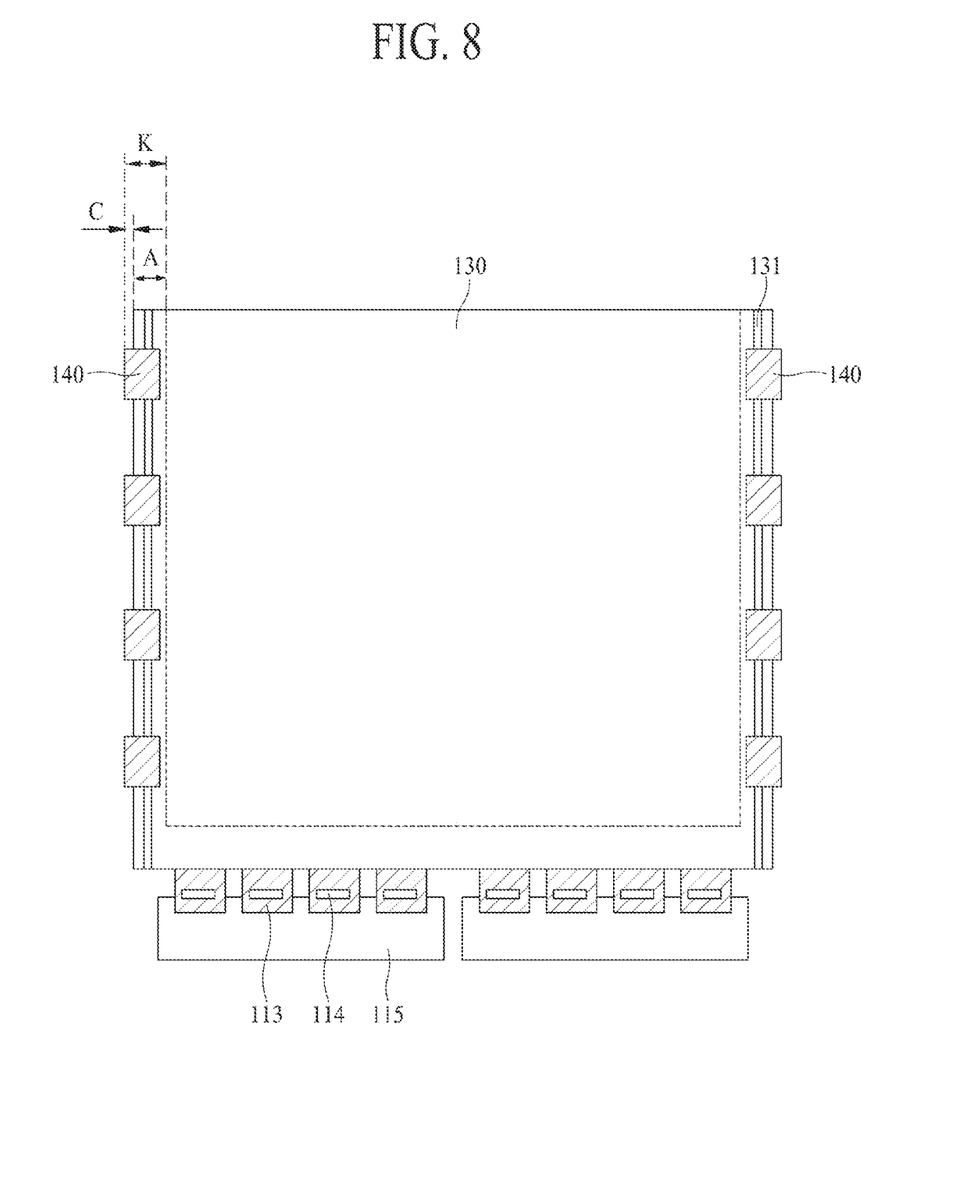
FIG. 8 is an exemplary diagram illustrating a rear surface of the transparent display apparatus according to an embodiment of the present invention.

FIG. 7 is an example diagram illustrating a front of the transparent display apparatus according to an embodiment of the present invention, and FIG. 8 is an example diagram illustrating a rear surface of the transparent display apparatus according to an embodiment of the present invention.

The transparent display apparatus according to an embodiment of the present invention may include the transparent panel 110 and the back cover 130 and may further include the light shield panel 120 and the film housing 140. FIGS. 7 and 8 illustrate a front and a rear surface of the transparent display apparatus including the film housing 140 according to an embodiment of the present invention.

A size K of a bezel of each of a left side and a right side of the transparent display apparatus according to an embodiment of the present invention may correspond to a sum of a width A of the pad part P and a width of a portion of the chip-on film 111 protruding to outside the pad part P.

When the chip-on film 111 is covered by the film housing 140, as illustrated in FIGS. 7 and 8, the size K of the bezel of each of the left side and right side of the transparent display apparatus may correspond to a sum of the width A of the pad part P and a width C of a portion of the film housing 130 protruding to outside the pad part P.

In this case, as illustrated in FIG. 8, the chip groove 131 may be disposed at a position corresponding to the pad part P. Therefore, the chip groove 131 does not affect the size K of the bezel of the transparent display apparatus. A thickness of the back cover 130 may be adjusted in order for the chip 112 to be disposed in the chip groove 131. Moreover, the chip 112 may be disposed in the chip groove 131 by changing the thickness of the back cover 130 and a curvature of the side surface of the back cover 130 on which the chip-on film 111 is disposed.

The above-described embodiment of the present invention will be briefly summarized. One of the purpose of the embodiments is to reduce the size of the bezel of the left side and right side of the transparent panel to which the chip-on film is attached. To this end, the transparent back cover 130 may be disposed on the rear surface of the transparent panel 110, and the chip groove 131, into which the chip 112 equipped in the chip-on film 111 attached to the transparent panel 110 is inserted, may be disposed in the rear surface of the back cover 130.

In the related art, since a chip-on film (in detail, a gate driver chip-on film including a gate driver chip performing a function of a gate driver) is mounted on a case without being bent, a size of a bezel increases due to a width of the chip-on film. However, according to the embodiments of the present invention, the chip-on film 111 equipped with the gate driver chip may be bent by the back cover 130, and the gate driver chip 112 mounted on the chip-on film 111 may be inserted into and fixed to the chip groove 131. Therefore, the size of the bezel of the transparent display apparatus including the transparent panel 110 to which the chip-on film 111 is attached is reduced.

Moreover, according to the embodiments of the present invention, the film housing 140 may be used in order for the chip-on film 111, which is bent along the back cover 130, to be closely adhered to the back cover 130. For example, the film housing 140 may be mounted on the side surface of the transparent panel 110 and the side surface of the back cover 130 to cover the side surface of the transparent panel 110, the side surface of the back cover 130, and the chip-on film 111.

The film housing 140 may be formed of magnesium (Mg), rubber, urethane, and/or the like. Since the side surface of the film housing 140 is rounded, the chip-on film 111 is not broken.

As described above, according to the embodiments of the present invention, the chip-on film included in the pad part of the transparent panel is bent to the rear surface of the back cover along the side surface of the back cover, and the chip equipped in the chip-on film is inserted into the chip groove disposed in the rear surface of the back cover. Accordingly, a size of the bezel of the transparent display apparatus including the transparent panel is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transparent display device comprising:
a transparent panel comprising pixels configured to generate images;
at least one flexible substrate that is bent backwards, each of the flexible substrate having one end electrically coupled to a pad region of the transparent panel, each of the flexible substrate comprising at least one integrated circuit (IC) chip configured to apply signals to gates of transistors in the pixels;
a back cover at a rear side of the transparent panel, the back cover with at least one groove on a rear surface of the back cover to accommodate the IC chip of the at least one flexible substrate, the at least one groove having a depth shallower than a thickness of the back cover; and
at least one film housing,
wherein one side of the film housing is disposed in the pad region of the transparent panel to contact one side of the flexible substrate connected to the pad region,
the other side of the film housing is disposed on the rear surface of the back cover to contact the other side of the flexible substrate disposed on the rear surface of the back cover.

2. The transparent display device of claim 1, further comprising a light shield panel between the transparent panel and the back cover, the light shield panel configured to switch between a blocking mode and a transmit mode, light entering through the back cover blocked by the light shield panel in the blocking mode, at least part of light entering through the back cover transmitted to the transparent panel via the light shield panel in the transmit mode.

3. The transparent display device of claim 1, wherein the back cover comprises a curved edge abutting the bent flexible substrate to define curvature of the flexible substrate.

4. The transparent display device of claim 1, wherein the transparent panel comprises an upper substrate and a lower substrate between the upper substrate and the back cover, wherein the lower substrate includes the pad region, and wherein the flexible substrate is bent backward over the lower substrate.

5. The transparent display device of claim 1, wherein the film housing covers a side surface of the at least one flexible substrate, a side surface of the transparent panel, and a side surface of the back cover, and presses the IC chip of the at least one flexible substrate into the at least one groove.

6. The transparent display device of claim 5, wherein each of the film housing includes a first portion covering part of a front surface the transparent panel facing away from the back cover, a second portion covering part of the rear surface of the back cover, and a third portion connecting the first and second portions, the first portion to press onto the front surface and the second portion pressed onto the rear surface of the back cover by resilient force.

7. The transparent display device of claim 1, wherein the at least one groove comprises a plurality of grooves formed on the rear surface of the back cover to accommodate a plurality of IC chips.

8. The transparent display device of claim 1, wherein the groove extends from one edge of the back cover to another edge of the back cover.

9. The transparent display device of claim 1, wherein a portion of the transparent panel coupled to the end of each of the flexible substrate faces away from the back cover.

10. A back cover in a transparent display device, comprising:
a front side facing a transparent panel comprising pixels configured to generate images;
a rear side of the transparent panel formed with at least one groove to accommodate at least one integrated circuit (IC) chip mounted on at least one flexible substrate and apply signals to gates of transistors in the transparent panel via a pad region to generate the images, each of the flexible substrate having one end electrically coupled to the pad region of the transparent panel, the at least one groove having a depth shallower than a thickness of the back cover; and a curved edge abutting the at least one flexible substrate that is bent backwards, the curved edge configured to define curvature of the flexible substrates s, wherein one side of each of at least one film housing is disposed in the pad region of the transparent panel to contact one side of the flexible substrate connected to the pad region, and the other side of each of the at least one film housing is disposed on a rear surface of the back cover to contact the other side of the flexible substrate disposed on the rear surface of the back cover.

11. The back cover of claim 10, wherein the transparent panel comprises an upper substrate and a lower substrate between the upper substrate and the back cover, wherein the lower substrate includes the pad region, and wherein the flexible substrate is bent backward over the lower substrate.

12. The back cover of claim 10, wherein at least a part of the curved edge is configured to be covered by the film housing covering the at least one flexible substrate and pressing the IC chip of the at least one flexible substrate into the at least one groove.

13. The back cover of claim 10, wherein the front side and the rear side are configured to abut at least one film housing that presses the IC chip of the at least one flexible substrate into the at least one groove.

14. The back cover of claim 10, wherein the at least one groove comprises a plurality of grooves formed on the rear surface of the back cover to accommodate a plurality of IC chips.

15. The back cover of claim 10, wherein the groove extends from one edge of the back cover to another edge of the back cover.

16. A method of manufacturing a transparent display device, comprising:

electrically coupling an end of a flexible substrate to a pad region of a transparent panel;

bending the flexible substrate backward over a curved edge of a back cover at a rear side of the transparent panel so that a rear surface of the flexible substrate abuts the curved edge of the back cover; accommodating an integrated circuit (IC) chip of the flexible substrate in a groove at a rear side of the back cover, the IC chip for applying signals to gates of transistors in pixels, the groove having a depth shallower than a thickness of the back cover; and covering the flexible substrate by a film housing, wherein one side of the film housing is disposed in the pad region of the transparent panel to contact one side of the flexible substrate connected to the pad region, and the other side of the film housing is disposed on a rear surface of the back cover to contact the other side of the flexible substrate disposed on the rear surface of the back cover.

17. The method of claim 16, wherein the flexible substrate is bent over an edge of a light shield panel switching between a blocking mode and a transmit mode, light entering through the back cover blocked by the light shield panel in the blocking mode, at least part of light entering through the back cover transmitted to the transparent panel via the light shield panel in the transmit mode.

18. The method of claim 17, further comprising forming the back cover with the groove at the rear side of the back cover.

19. The method of claim 17, wherein the flexible substrate is bent over a lower substrate of the transparent panel but not bent over an upper substrate of the transparent panel, the pad region provided in the lower substrate of the transparent panel.

* * * * *